United States Patent [19]

LaPrade

[11] Patent Number: 4,737,733
[45] Date of Patent: Apr. 12, 1988

[54] OVERDRIVE CONTROL OF FET POWER AMPLIFIER

[75] Inventor: James N. LaPrade, Middlesex County, N.J.

[73] Assignee: RCA Corporation, Princeton, N.J.

[21] Appl. No.: 924,315

[22] Filed: Oct. 29, 1986

[51] Int. Cl.[4] .......................... H03F 3/16; H03G 3/10
[52] U.S. Cl. ..................................... 330/277; 330/279
[58] Field of Search ....................... 330/277, 279, 284

[56] References Cited

U.S. PATENT DOCUMENTS

| | | | |
|---|---|---|---|
| 4,057,765 | 11/1977 | Schuermann | 330/279 |
| 4,147,991 | 4/1979 | Ijichi et al. | 330/284 |
| 4,320,352 | 3/1982 | Rubin et al. | 330/277 |
| 4,420,724 | 12/1983 | Owen | 330/277 |
| 4,553,105 | 11/1985 | Sasaki | 330/284 |

OTHER PUBLICATIONS

N. LaPrade et al., "Ku-Band SSPA for Communications Satellites," *AIAA Proceedings*, Mar. 1986, pp. 321-325.

*Primary Examiner*—Gene Wan
*Attorney, Agent, or Firm*—Clement A. Berard, Jr.; William H. Meise; Robert L. Troike

[57] ABSTRACT

An overdrive control for a GaAs FET power amplifier is provided by a PIN diode attenuator positioned at the input of the FET amplifier where the amount of attenuation is controlled by a control signal derived from the gate current of the following FET amplifier.

5 Claims, 1 Drawing Sheet

OVERDRIVE CONTROL OF FET POWER AMPLIFIER

This invention relates to FET power amplifiers and, more particularly, to overdrive protection for gallium arsenide (GaAs) FET power amplifiers.

BACKGROUND OF THE INVENTION

Solid state power amplifiers used in satellite communication systems are accessed from ground station terminals. There is a risk of potentially uncontrolled uplink power which could overdrive the gallium arsenide FET output devices in the solid state power amplifiers. These FET devices are sometimes referred to as MESFET (metal semiconductor) devices. The solid state power amplifiers on the satellite are adapted to receive certain ranges of input power. Higher ranges of input power can occur after, for example, the ground stations have increased the amount of input power to correct for conditions, such as rain conditions, which degrade the input power and these terminals are not turned back immediately when the weather conditions change. The extended overdrive can degrade the solid state amplifier reliability due to excessive gate currents induced from the incoming microwave signal. These FET devices utilize very narrow (on the order of 0.5 micron) gate metal structures which can be damaged from excessive current density.

It is therefore desirable to provide some means at the satellite, i.e., at the amplifier, to sense the onset of excessive gate current and to limit the microwave power applied to the amplifier before any damage (reliability degradation) threshold is exceeded.

SUMMARY OF THE INVENTION

In accordance with one embodiment of the present invention an overdrive control is provided for a gallium arsenide (GaAs) FET solid state RF power amplifier comprising a variable attenuator coupled to the input of the power amplifier and responsive to a control signal at one input for limiting the amplitude level of input RF signals applied thereto and means coupled to the gate electrode of said power amplifier for producing said control signal to said amplifier. The control signal is proportional to the sensed gate current at the power amplifier.

PREFERRED EMBODIMENT OF THE PRESENT INVENTION

Figure 1:
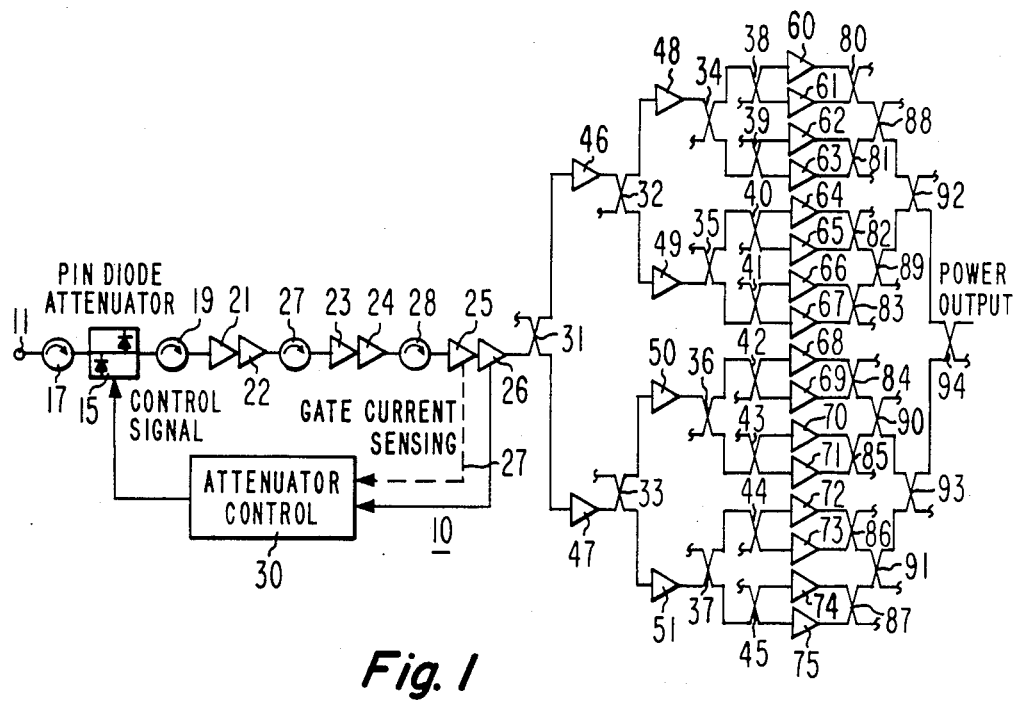
FIG. 1 is a block diagram of the overall solid state power amplifier system with overdrive protection according to one embodiment of the present invention.

Referring to FIG. 1 there is illustrated a block diagram of the overall solid state power amplifier 10 as may be found in the solid state power amplifiers of a communication satellite. As is well known, the uplink signals transmitted from the ground stations are transmitted at an uplink frequency such as 14 GHz, for example, received at the satellite, are converted to a downlink frequency such as 12 GHz, for example, and are amplified and transmitted from the satellite back to earth. The uplink signals which have been converted to the downlink frequencies are present at terminal 11 of FIG. 1 to be amplified sufficient to be retransmitted. These RF signals are applied to PIN diode attenuator 15 which is isolated on either side by isolator circulators 17 and 19. The RF input signals are then amplified by a chain of GaAs FET power amplifiers 21 through 26 where these FET amplifiers are connected together in pairs with an isolation circulator between each pair as represented by the isolating circulators 27 and 28. The amplifiers are all GaAs FET solid state power amplifiers which amplify the signals at intermediate power levels. The amplified signal at the output of amplifier 26 is applied to a power dividing and amplifying network comprising 3 db couplers 31 through 45 in a tree configuration and GaAs FET power amplifiers 46 through 51 to provide 16 outputs to 16 GaAs FET power amplifiers 60 through 75 where these amplifiers 60 through 75 are also GaAs FET power amplifiers for amplifying the input signals. A combiner network arranged in a tree configuration of 3 db couplers 80 through 94 without intermediate amplifiers combines the power to provide high power output at coupler 94. All of the GaAs FET devices in a preferred embodiment are on a common monolithic microwave integrated circuit. These devices may also be referred to as MESFET metal semiconductor field effect transistors.

In accordance with the preferred embodiment of the present invention a control signal is provided to a PIN diode attenuator 15. This control signal is provided by sensing the gate current in one of the power amplifier stages and, more particularly, at one of the intermediate stages. In the preferred embodiment this sensing is at the final intermediate GaAs FET amplifier stage 26 in FIG. 1. This sensing may be done at any of the stages following the attenuator. The gate current at the final intermediate FET amplifier stage 26 is sensed to derive a control signal at attenuator control 30. Control 30 provides a control signal by rectifying the GaAs FET power amplifier 26 gate current to provide a rectified signal and by that rectified signal exceeding a suitable threshold level. The control signal is applied to the PIN diode attenuator 15 to reduce the RF input to the amplifier stages 21 through 26 in proportion to that sensed gate current when the gate current exceeds a predetermined threshold. It may be desirable that the attenuator 15 be on the same integrated circuit. It further may be desirable in some applications that the attenuator be located after the preamplifiers 21 and 22.

Figure 2:
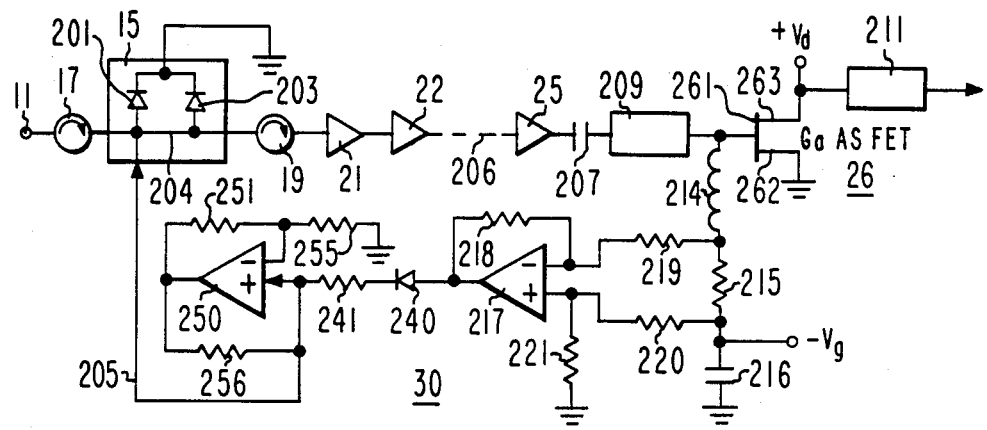
FIG. 2 is a schematic diagram of one GaAs FET power amplifier stage, attenuator control circuitry and the PIN diode attenuator of FIG. 1.

Referring to FIG. 2 there is illustrated a schematic diagram of portions of the overall diagram as shown in FIG. 1. The elements in FIG. 2 that correspond to elements in FIG. 1 will have the same numerical designation. As illustrated in FIG. 2 the PIN diode attenuator 15 is located between the circulators 17 and 19. The PIN diode attenuator 15 includes a pair of PIN diodes 201 and 203 having their anodes connected to the input-/output line 204 of the attenuator 15. The cathode terminals of diodes 201 and 203 are coupled to ground potential. Also applied to the anodes of diodes 201 and 203 is a control signal on lead 205 from the attenuator control 30. The output from the attenuator 15 is applied via circulator 19 to the intermediate stage gallium arsenide FET amplifiers 21 through 25 which are only represented in blocks 21, 22 and 25 and by dashed lines 206 in FIG. 2. The output from amplifier 25 is coupled via coupling capacitor 207 and an impedance matching section 209 to the gate electrode 261 of GaAs FET power transistor amplifier 26. Amplifier 26 includes a single gate GaAs FET transistor device with a source electrode 262 coupled to ground, a drain electrode 263 coupled to a drain source represented as $+V_d$ for biasing the device at, for example, a supply voltage of about 9 volts. Output is taken from the drain electrode 263 and applied via an impedance matching network 211 to the power divider stages shown in FIG. 1.

A gate bias voltage, $-V_g$, is applied via sensing resistor 215 to the gate electrode 261. A microwave choke is provided by inductor 214 and an RF bypass of the gate bias voltage source is provided by capacitor 216. A sensing amplifier including a sensing differential amplifier stage is provided by a differential amplifier 217 where the inverting terminal (−) is coupled via resistor 219 to the gate terminal end of resistor 215 and the noninverting terminal (+) is coupled via resistor 220 to the gate voltage end of resistor 215. A voltage dividing resistor 221 is coupled to resistor 220 at the positive terminal (+) end to provide a reference level voltage to the positive terminal (+) of differential amplifier 217. Gain control of the amplifier is provided by the feedback resistor 218 in the feedback loop between the output and the negative input. The output of the differential amplifier 219 is coupled to a threshold diode 240 to supply the sensed control signal via resistor 241 to the input of another differential amplifier 250. The reference voltage is provided to the negative input of amplifier 250 by resistors 251 and 255 and gain control is provided by a feedback resistor 256. The amplifier 250 is configured therefore as a constant current source where resistors 241, 251, 255 and 256 are the same value of resistance. That value is selected to bias the PIN diodes 201 and 203 into the desired region of the attenuation characteristic.

In accordance with the operations of the embodiment of FIG. 2 microwave signals applied to terminal 11 are applied via PIN diode attenuator 15 to amplifiers 21 through amplifier 25. The output from amplifier 25 is coupled via capacitor 207 and an impedance matching network 209 to the gate 261 of FET amplifier 26. As the incidence of microwave energy increases at the gate-source input of the common source configured amplifier illustrated in FIG. 2, dynamic gate current is increased due to rectification of the gate current by the gate-source diode inherent in a Schottky barrier type junction inherent in a GaAs FET device. The gate bias current passes through the resistors 220 and 221 and sets up a reference voltage at the plus terminal of amplifier 217. As the dynamic current increases due to the gate-source diode rectification there is an increased voltage drop across resistor 215 and a greater difference voltage at the + and − terminals of difference amplifier 217 causing increased output. When this output exceeds the threshold of input diode 240, a control signal is provided to the input of PIN diode attenuator 15 to cause further conduction of the PIN diodes and thereby decrease the amount of applied microwave energy passing from circulator 17 to circulator 19.

Other embodiments of the invention will be apparent to those skilled in the art. For example, the control signal can be derived from any single gate electrode on any single FET device or any combination of currents derived from any combination of gate electrodes of FET devices 21, 22, 23, 24, 25, 26, 46 through 51 and 60 through 75. For example, the current from amplifier 25, as represented by dashed line 27, may also be applied to control 30. The attenuator 15 may be located after the initial input stages 21 and 22, for example, to improve the amplifier noise figure while maintaining overdrive protection for the GaAs FET stages which follow the attenuator.

In accordance with one embodiment, the circuit of FIG. 2 would typically have the following values:
Resistors 218, 221, 219, 222—1K ohm
Resistor 215—5K ohm
Resistors 241, 251, 255, 256—100K ohm
Differential amplifiers 250 and 217 are 747 AF type
Diode 240—IN419
Inductor 214—printed circuit quarter wave choke PIN diodes 201 and 203 were DSB 6907-99 from ALPHA Industries of Woburn, Mass.
FET 26 is FLK 022WG from Fujitsu of Kawasaki, Japan
Capacitor 216 1 microfarad
The gate bias $-V_g$ would be −5 volts.

I claim:
1. In combination:
a FET power amplifier including a gate electrode;
an overdrive control further comprising
(a) a controllable attenuator adapted to be coupled to a source of RF signal to be amplified and coupled to said gate electrode of said power amplifier, said controllable attenuator further including a control input terminal and being responsive to a control signal applied to said control input terminal of said controllable attenuator for controlling the amplitude level of said RF signal applied through said controllable attenuator to said power amplifier; and
(b) control signal generating means coupled to said gate electrode of said power amplifier and to said control input terminal of said controllable attenuator for generating said control signal and for coupling said control signal to said controllable attenuator in response to the current sensed at said gate electrode.

2. The combination of claim 1 wherein said FET power amplifier is a GaAs FET amplifier.

3. The combination of claim 1 wherein said controllable attenuator is a PIN diode attenuator.

4. The combination of claim 1 wherein said power amplifier includes a plurality of GaAs FET devices on a common monolithic microwave integrated circuit.

5. The combination of claim 4 wherein said attenuator resides within said common integrated circuit.

* * * * *